United States Patent
Lee et al.

(10) Patent No.: US 7,931,752 B2
(45) Date of Patent: Apr. 26, 2011

(54) METHOD FOR CLEANING SEMICONDUCTOR EQUIPMENT

(75) Inventors: Chong-Tat Lee, Singapore (SG); Jui-Lin Tang, Chiayi (TW); Chee-Thim Loh, Johor Bahru. (MY); Kok-Poh Chong, Singapore (SG)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 347 days.

(21) Appl. No.: 12/349,280

(22) Filed: Jan. 6, 2009

(65) Prior Publication Data
US 2010/0170530 A1 Jul. 8, 2010

(51) Int. Cl.
*B08B 9/08* (2006.01)
(52) U.S. Cl. ............ 134/1.1; 134/22.1; 166/67; 438/905
(58) Field of Classification Search .............. 134/1, 1.1, 134/22, 42, 902; 438/905; 216/67
See application file for complete search history.

(56) References Cited

U.S. PATENT DOCUMENTS

| | | | |
|---|---|---|---|
| 6,200,412 B1 | 3/2001 | Kilgore et al. |
| 7,055,212 B2 | 6/2006 | Blanco-Rivera et al. |
| 2002/0195124 A1 | 12/2002 | Chin et al. |

*Primary Examiner* — Michael Barr
*Assistant Examiner* — Saeed T Chaudhry
(74) *Attorney, Agent, or Firm* — Winston Hsu; Scott Margo

(57) ABSTRACT

A method for cleaning a semiconductor equipment is provided. First, a first cleaning step is performed to the process chamber. The first cleaning step includes conducting a cleaning gas into the process chamber via a short processing gas injector for generating a plasma of the cleaning gas in the process chamber. Then, a cleaning step is performed to a long cleaning gas injector. The cleaning step performed to the long cleaning gas injector includes conducting the cleaning gas into the process chamber via the long processing gas injector. Then, a second cleaning step is performed to the process chamber. The second cleaning step includes conducting the plasma of the cleaning gas into the process chamber via the short processing gas injector.

20 Claims, 2 Drawing Sheets

METHOD FOR CLEANING SEMICONDUCTOR EQUIPMENT

BACKGROUND OF THE INVENTION

1. Field of the Invention

The present invention generally relates to semiconductor technology, and more particularly, to a method for cleaning a semiconductor equipment.

2. Description of Related Art

Generally, in a deposition process or an etching process performed to a wafer, the processing gas employed in the process will deposit on an inner surface of a process chamber of the semiconductor equipment, and the deposits result in particles in the process chamber. These particles may unfortunately fall down to processing wafers, thus causing the wafers rejected and drastically lowering the yield of the wafers. As such, after the semiconductor equipment processes a certain amount of wafers, the process chamber of the semiconductor equipment should be cleaned for removing the deposits remained upon the inner surface of the process chamber.

Typically, nitrogen trifluoride ($NF_3$) is often used as a cleaning gas for cleaning the process chamber. Specifically, the $NF_3$ gas is introduced into the process chamber and used to etch the deposits deposited upon a dome and the inner wall of the process chamber. It should be noted that the semiconductor equipment further includes a plurality of processing gas injectors adapted for providing processing gas to the process chamber. The processing gas may also form deposits on inner walls of the processing gas injectors, and these deposits may also fall down to the wafers. Unfortunately, the present process of cleaning the process chamber is to introduce cleaning gas by specific cleaning gas injectors, and the process of cleaning the process chamber is incapable of cleaning the inner walls of the processing gas injectors and it results in low yield.

As such, a method for cleaning a semiconductor equipment which is adapted for effectively cleaning an inside of a process chamber and an inner wall of a processing gas injector is desired for improving a yield of wafers.

SUMMARY OF THE INVENTION

Accordingly, the present invention is directed to provide a method for cleaning a semiconductor equipment, for effectively cleaning an inside of a process chamber and an inner wall of a processing gas injector.

The present invention provides a method for cleaning a semiconductor equipment. First, a first cleaning step is performed to the process chamber. The first cleaning step includes conducting a cleaning gas into the process chamber via a short processing gas injector for generating a plasma of the cleaning gas in the process chamber. Then, a cleaning step is performed to a long cleaning gas injector. The cleaning step performed to the long cleaning gas injector includes conducting the cleaning gas into the process chamber via the long processing gas injector. Then, a second cleaning step is performed to the process chamber. The second cleaning step includes conducting the plasma of the cleaning gas into the process chamber via the short processing gas injector.

According to an embodiment of the present invention, the cleaning gas includes a nitrogen trifluoride ($NF_3$) gas.

According to an embodiment of the present invention, the cleaning gas used in the first cleaning step performed to the process chamber has a first flux, and the cleaning gas used in the cleaning step performed to the long processing gas injector has a second flux, in which the second flux is about ⅛ to ⅕ of the first flux.

According to an embodiment of the present invention, the plasma of the cleaning gas used in the second cleaning step performed to the process chamber has a first flux, and the cleaning gas used in the cleaning step performed to the long processing gas injector has a second flux, in which the second flux is about 1/14 to ⅛ of the first flux.

According to an embodiment of the present invention, the cleaning gas used in the cleaning step performed to the long processing gas injector has a flux in a range from 150 to 250 standard cubic centimeters per minute (sccm).

According to an embodiment of the present invention, the cleaning gas used in the first cleaning step performed to the process chamber has a flux in a range from 1000 to 2000 sccm.

According to an embodiment of the present invention, the plasma of the cleaning gas used in the second cleaning step performed to the process chamber has a flux in a range from 1500 to 2500 sccm.

According to an embodiment of the present invention, the cleaning step performed to the long processing gas injector further includes conducting a helium gas into the process chamber.

According to an embodiment of the present invention, the cleaning step performed to the long processing gas injector further includes conducting a hydrogen gas into the process chamber.

According to an embodiment of the present invention, the first cleaning step performed to the process chamber further includes conducting an oxygen gas into the process chamber.

According to an embodiment of the present invention, the long processing gas injector includes a closed end, and the cleaning gas is conducted into the process chamber via a through hole positioned at a sidewall of the long processing gas injector.

According to an embodiment of the present invention, the short processing gas injector and the long processing gas injector are arranged surrounding a central axis of the process chamber.

According to an embodiment of the present invention, the method further includes performing a protection step to the process chamber. The protection step includes conducting a hydrogen gas into the process chamber.

According to an embodiment of the present invention, the protection step performed to the process chamber further includes conducting an oxygen gas into the process chamber.

According to an embodiment of the present invention, the hydrogen gas used in the protection step has a flux in a range from 1000 to 2000 sccm.

According to an embodiment of the present invention, the cleaning step performed to the long processing gas injector lasts for a time in a range from 15 to 25 seconds.

According to an embodiment of the present invention, the second cleaning step performed to the process chamber lasts for a time in a range from 160 to 200 seconds.

According to an embodiment of the present invention, when the first cleaning step is performed to the process chamber, the process chamber is maintained at a pressure in a range from 0.9 to 1.1 Torr.

According to an embodiment of the present invention, when the cleaning step is performed to the long processing gas injector, the process chamber is maintained at a pressure in a range from 0.9 to 1.1 Torr.

According to an embodiment of the present invention, when the second cleaning step is performed to the process chamber, the process chamber is maintained at a pressure in a range from 5.5 to 6.5 Torr.

The method for cleaning a semiconductor equipment according to the present invention is adapted for effectively cleaning the inside of the process chamber and the inner wall of the long processing gas injector. Therefore, it can be avoided that deposits deposited inside the process chamber and on the inner wall of the long processing gas injector fall down to the wafers, thus improving the yield and the productivity of the wafers.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
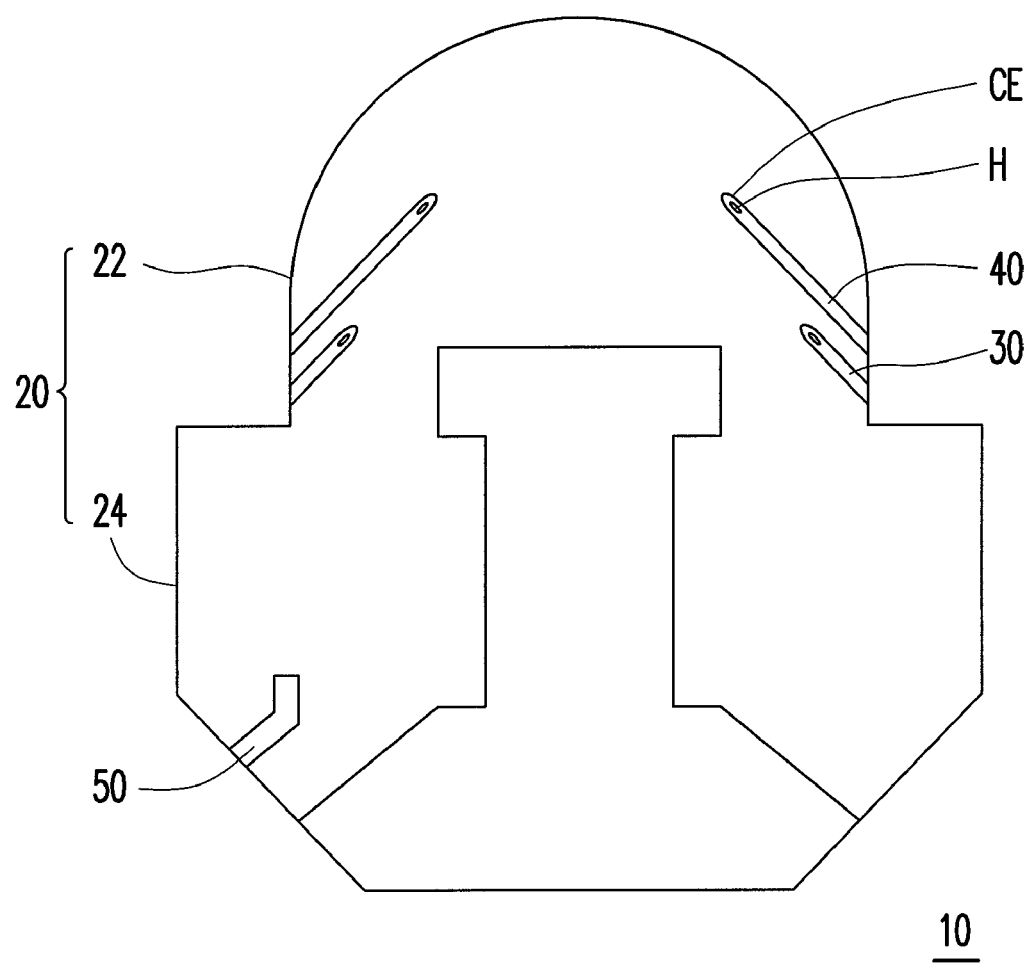
FIG. 1 schematically illustrates a view of a semiconductor equipment according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 schematically illustrates a view of a semiconductor equipment according to a first embodiment of the present invention. In the current embodiment, the semiconductor equipment 10 includes a process chamber 20, a short processing gas injectors 30, and a long processing gas injectors 40. The process chamber 20 for example is adapted for performing a high-density plasma chemical vapour deposition (HDP-CVD). The process chamber includes a dome 22 and an inner wall 24. The short processing gas injectors 30 and the long processing gas injectors 40 for example are arranged surrounding a central axis of the process chamber 20, for delivering a processing gas and a cleaning gas into the process chamber 20. The short processing gas injectors 30 and the long processing gas injectors 40 are arranged alternatively, and an inclined angle of the short processing gas injector 30 (an included angle between the short processing gas injector 30 and a vertical line) may be different from that of the long processing gas injector 40. Particularly, each of the short processing gas injectors 30 and the long processing gas injectors 40 has a closed end CE, and the cleaning gas is introduced to the process chamber 20 via a through hole H positioned at a sidewall of the short processing gas injector 30 or that of the long processing gas injector 40 in the embodiment. Preferably, the short processing gas injector has a length in a range from 30 mm to 40 mm, and the long processing gas injector has a length in a range from 200 mm to 220 mm. Moreover, the semiconductor equipment 10 includes the specific cleaning gas injector 50.

Figure 2:
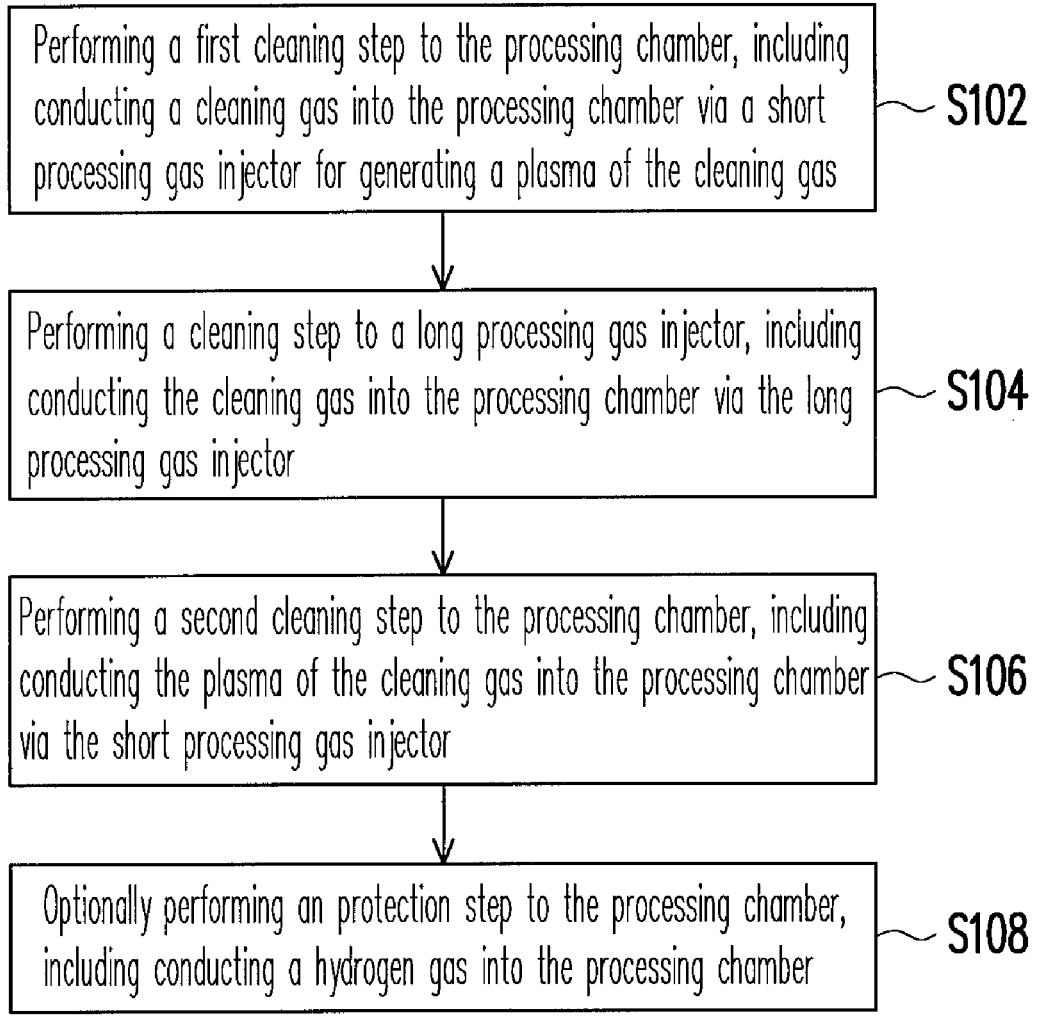
FIG. 2 is a flow chart illustrating a method for cleaning a semiconductor equipment according to an embodiment of the present invention.

A cleaning method to clean the semiconductor equipment illustrated in FIG. 1 is described as follows. FIG. 2 is a flow chart illustrating a method for cleaning a semiconductor equipment according to an embodiment of the present invention.

Referring to FIG. 1 and FIG. 2, first, at step S102, the process chamber 20 is performed with a first cleaning step. The first cleaning step includes conducting a cleaning gas into the process chamber 20 via a short processing gas injector 30, for generating a plasma of the cleaning gas in the process chamber 20. This step is mainly for removing deposits deposited on the dome 22 of the process chamber (e.g., silicon dioxide). The cleaning gas used in the step S102 for example is a nitrogen trifluoride ($NF_3$) gas having a flux for example in a range from 1000 to 2000 standard cubic centimeters per minute (sccm) and preferably of 1500 sccm. When the step S102 is performing, the pressure in the process chamber is maintained in a range from 0.9 to 1.1 Torr, and preferably at 1 Torr. Further, a high frequency power of the process chamber is maintained between about 2500 to 3500 W, and preferably at 3000 W, while a low frequency power of the process chamber is maintained at 0 W. In the current embodiment, whether the step S102 is completed can be determined by an endpoint detection method. Further, according to an embodiment of the present invention, when the step S102 is performing, an oxygen gas can be optionally conducted into the process chamber. The oxygen gas for example has a flux in a range from 140 to 160 sccm, and preferably of 150 sccm.

Then, at step S104, a cleaning step is performed to a long processing gas injector 40. The cleaning step performed to the long processing gas injector 40 includes conducting a cleaning gas into the process chamber via the long processing gas 40. It should be noted that this step is mainly for removing deposits deposited on an inner wall of the long processing gas injector 40 by conducting a $NF_3$ gas to slowly flow through the long processing gas injector 40. As such, a flux of the cleaning gas used in the step S104 is lower than that used in the step S102. For example, the cleaning gas used in step S102 has a first flux, and the cleaning gas used in step S104 has a second flux. The second flux for example is about 1/8 to 1/5 of the first flux. The cleaning gas used in the step S104 for example is a nitrogen trifluoride ($NF_3$) gas having a flux for example in a range from 150 to 250 sccm and preferably of 200 sccm. When the step S104 is performing, the pressure in the process chamber is maintained in a range from 0.9 to 1.1 Torr, and preferably at 1 Torr. Further, the high frequency power of the process chamber is maintained between about 1000 to 2000 W, and preferably at 1500 W, while the low frequency power of the process chamber is maintained between about 2700 to 3700 W, and preferably at 3200 W. In the current embodiment, the step S104 for example lasts for a time in a range from 15 to 25 seconds, and preferably for 20 seconds. Further, according to an embodiment of the present invention, when the step S104 is performing, a helium gas and a hydrogen gas can be optionally conducted into the process chamber through the specific cleaning gas injector 50. The hydrogen gas reacts with the fluoride ions to remove the additional fluorine gas, and the helium gas stabilizes the chemical reactions during the cleaning process and reduces the pressure changes. The helium gas for example has a flux in a range from 150 to 250 sccm, and preferably of 200 sccm, and the hydrogen gas for example has a flux in a range from 450 to 550 sccm, and preferably of 500 sccm.

Further, it should be noted that in the current embodiment, the long processing gas injector 40 for example includes a closed end CE, and the cleaning gas is conducted into the process chamber 20 via a through hole H positioned at a sidewall of the long processing gas injector 40. Generally, it is more difficult to remove deposits deposited on the inner wall of the long processing gas injector, particularly when the long processing gas injector includes a closed end. However, the step S104 can effectively clean the inner wall of the long processing gas injector 40, even when it includes a closed end CE. Furthermore, in the current embodiment, the first cleaning step performed to the process chamber 20 is performed first, and thereafter the cleaning step performed to the long processing gas injector 40 is performed. However, in other embodiments of the present invention, the sequence can be switched in that the cleaning step performed to the long processing gas injector is performed first, and the first cleaning step performed to the process chamber is performed thereafter.

Then, at step S106, a second cleaning step is performed to the process chamber 20. The second cleaning step performed to the process chamber includes conducting the plasma of the cleaning gas produced by a remote plasma source into the process chamber 20 via a short processing gas injector 30. This step is mainly for removing deposits deposited on the inner wall 24 of the process chamber, e.g., silicon dioxide. In the current embodiment, the plasma of the cleaning gas includes a plasma of $NF_3$ gas having a flux for example in a range from 1500 to 2500 sccm, and preferably of 2000 sccm. It should be noted that the plasma of the cleaning gas used in step S106 has a third flux, and the cleaning gas used in step S104 has a forth flux. The third flux for example is about $1/14$ to $1/9$ of the forth flux. When performing the step S106, the pressure in the process chamber is maintained in a range from 5.5 to 6.5 Torr, and preferably at 6 Torr. Further, the high frequency power of the process chamber is maintained at 0 W, while the low frequency power of the process chamber is maintained at 0 W. In the current embodiment, the step S106 for example lasts for a time in a range from 160 to 200 seconds, and preferably for 180 seconds.

Then, after all cleaning steps are completed, a step S108 can be optionally performed. At step S108, a protection step is performed to the process chamber 20. The protection step includes conducting a hydrogen gas into the process chamber 20. In the current embodiment, the hydrogen gas for example is conducted into the process chamber 20 via the short processing gas injector 30. This step can be considered as a recovery step. In the recovery step, the hydrogen is provided for reacting with the fluorine contained in the cleaning gas so as to remove the cleaning gas remained in the process chamber 20, thus preventing subsequent processes from being affected by the remained cleaning gas. In the step S108, the hydrogen gas for example has a flux in a range from 1000 to 2000 sccm, and preferably of 1500 sccm. When the step S108 is performing, the pressure in the process chamber is maintained in a range from 0.9 to 1.1 Torr, and preferably at 1 Torr. Further, the high frequency power of the process chamber is maintained between about 2800 to 3800 W, and preferably at 3300 W, while the low frequency power of the process chamber is maintained at 0 W. In the current embodiment, the step S108 for example lasts for a time in a range from 140 to 180 seconds, and preferably for 160 seconds. Further, in the step S108, an oxygen gas can be optionally conducted into the process chamber. The oxygen gas for example has a flux in a range from 350 to 450 sccm, and preferably of 400 sccm.

In summary, the method for cleaning a semiconductor equipment according to the present invention is adapted for effectively cleaning the inside of the process chamber and the inner wall of the long processing gas injector. Therefore, it can be avoided that deposits deposited inside the process chamber and on the inner wall of the long processing gas injector fall down to the wafers, thus improving the yield of the wafer products. Further, the method for cleaning a semiconductor equipment according to the present invention provides a solution to the long felt unsolved difficulty that the inner wall of the long processing gas injector is hard to clean. Furthermore, in a single cleaning process, both of the process chamber and the processing gas injectors are cleaned, and therefore the semiconductor equipment can be cleaned with less time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for cleaning a semiconductor equipment, comprising:
   performing a first cleaning step to a process chamber, wherein the first cleaning step comprises conducting a cleaning gas into the process chamber via a short processing gas injector for generating a plasma of the cleaning gas in the process chamber;
   performing a cleaning step to a long cleaning gas injector, wherein the cleaning step performed to the long cleaning gas injector comprises conducting the cleaning gas into the process chamber via the long processing gas injector; and
   performing a second cleaning step to the process chamber, wherein the second cleaning step comprises conducting the plasma of the cleaning gas into the process chamber via the short processing gas injector.

2. The method according to claim 1, wherein the cleaning gas comprises a nitrogen trifluoride ($NF_3$) gas.

3. The method according to claim 1, wherein the cleaning gas used in the first cleaning step performed to the process chamber has a first flux, and the cleaning gas used in the cleaning step performed to the long processing gas injector has a second flux, wherein the second flux is about $1/9$ to $1/5$ of the first flux.

4. The method according to claim 1, wherein the plasma of the cleaning gas used in the second cleaning step performed to the process chamber has a first flux, and the cleaning gas used in the cleaning step performed to the long processing gas injector has a second flux, wherein the second flux is about $1/14$ to $1/9$ of the first flux.

5. The method according to claim 1, wherein the cleaning gas used in the cleaning step performed to the long processing gas injector has a flux in a range from 150 to 250 standard cubic centimeters per minute (sccm).

6. The method according to claim 1, wherein the cleaning gas used in the first cleaning step performed to the process chamber has a flux in a range from 1000 to 2000 standard cubic centimeters per minute (sccm).

7. The method according to claim 1, wherein the plasma of the cleaning gas used in the second cleaning step performed to the process chamber has a flux in a range from 1500 to 2500 standard cubic centimeters per minute (sccm).

8. The method according to claim 1, wherein the cleaning step performed to the long processing gas injector further comprises conducting a helium gas into the process chamber.

9. The method according to claim 1, wherein the cleaning step performed to the long processing gas injector further comprises conducting a hydrogen gas into the process chamber.

10. The method according to claim 1, wherein the first cleaning step performed to the process chamber further comprises conducting an oxygen gas into the process chamber.

11. The method according to claim 1, wherein the long processing gas injector comprises a closed end, and the cleaning gas is conducted into the process chamber via a through hole positioned at a sidewall of the long processing gas injector.

12. The method according to claim 1, wherein the short processing gas injector and the long processing gas injector are arranged surrounding a central axis of the process chamber.

13. The method according to claim 1, further comprising performing a protection step to the process chamber, wherein the protection step comprises conducting a hydrogen gas into the process chamber.

14. The method according to claim 13, wherein the protection step performed to the process chamber further comprises conducting an oxygen gas into the process chamber.

15. The method according to claim 13, wherein the hydrogen gas used in the protection step has a flux in a range from 1000 to 2000 standard cubic centimeters per minute (sccm).

16. The method according to claim 1, wherein the cleaning step performed to the long processing gas injector lasts for a time in a range from 15 to 25 seconds.

17. The method according to claim 1, wherein the second cleaning step performed to the process chamber lasts for a time in a range from 160 to 200 seconds.

18. The method according to claim 1, wherein when the first cleaning step is performed to the process chamber, the process chamber is maintained at a pressure in a range from 0.9 to 1.1 Torr.

19. The method according to claim 1, wherein when the cleaning step is performed to the long processing gas injector, the process chamber is maintained at a pressure in a range from 0.9 to 1.1 Torr.

20. The method according to claim 1, wherein when the second cleaning step is performed to the process chamber, the process chamber is maintained at a pressure in a range from 5.5 to 6.5 Torr.

* * * * *